US009161453B2

(12) United States Patent
Koyanagi

(10) Patent No.: US 9,161,453 B2
(45) Date of Patent: Oct. 13, 2015

(54) WIRING BOARD AND METHOD OF MANUFACTURING THE SAME

(71) Applicant: SHINKO ELECTRIC INDUSTRIES CO., LTD., Nagano (JP)

(72) Inventor: Takaaki Koyanagi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 178 days.

(21) Appl. No.: 13/914,894

(22) Filed: Jun. 11, 2013

(65) Prior Publication Data
US 2013/0333930 A1 Dec. 19, 2013

(30) Foreign Application Priority Data

Jun. 15, 2012 (JP) ................. 2012-136118

(51) Int. Cl.
*H05K 1/18* (2006.01)
*H05K 3/30* (2006.01)
*H05K 3/00* (2006.01)
*H05K 3/46* (2006.01)

(52) U.S. Cl.
CPC ............... *H05K 1/184* (2013.01); *H05K 1/185* (2013.01); *H05K 3/0038* (2013.01); *H05K 3/301* (2013.01); *H05K 3/4661* (2013.01); *H05K 2201/10636* (2013.01); *Y10T 29/49117* (2015.01)

(58) Field of Classification Search
CPC ....... H05K 1/183; H05K 1/185; H05K 1/182; H05K 3/326; H05K 3/301; H05K 2201/09036; H05K 2201/1059; H05K 1/184
See application file for complete search history.

(56) References Cited

U.S. PATENT DOCUMENTS

| | | | | |
|---|---|---|---|---|
| 7,542,301 | B1* | 6/2009 | Liong et al. .................... | 361/761 |
| 7,883,378 | B2* | 2/2011 | Yamashita et al. ............ | 439/751 |
| 2008/0222876 | A1* | 9/2008 | Weber et al. .................. | 29/592.1 |
| 2011/0240354 | A1 | 10/2011 | Furuhata et al. | |

FOREIGN PATENT DOCUMENTS

JP 2011-216740 10/2011

\* cited by examiner

*Primary Examiner* — Jeremy C Norris
(74) *Attorney, Agent, or Firm* — IPUSA, PLLC

(57) ABSTRACT

A wiring board includes a core layer; a through hole penetrating through the core layer in a thickness direction of the core layer; and an electronic part accommodated inside the through hole, wherein the through hole includes a first opening portion provided on a first surface of the core layer, a second opening portion provided on a second surface of the core layer, and an inward protruding portion inwardly protruding relative to the first and second opening portions, and wherein the electronic part is held by the inward protruding portion.

23 Claims, 11 Drawing Sheets (a)

(b)

(c)

(d)

(a)

(b)

(c)

(a)

(b)

(c)

WIRING BOARD AND METHOD OF MANUFACTURING THE SAME

CROSS-REFERENCE TO RELATED APPLICATIONS

This application is based upon and claims the benefit of priority of the prior Japanese Patent Application No. 2012-136118, filed on Jun. 15, 2012, the entire contents of which are incorporated herein by reference.

FIELD

The embodiments discussed herein are related to a wiring board and a method of manufacturing the wiring board.

BACKGROUND

As an example, a wiring board may be provided with through holes by press work or drill work. An electronic part such as a capacitor may be accommodated inside the through holes of the wiring board. The through holes formed by the press work or the drill work penetrate the wiring board in its thickness direction while maintaining a substantially constant opening area (a through hole having a longitudinal cross-sectional shape other than a tapered shape). In the manufacturing process of the wiring board, for example, a mounter for an electronic part may be used to accommodate the capacitor or the like into the inside of the through hole as disclosed in Japanese Laid-open Patent Publication No. 2011-216740.

However, it is not easy to accommodate the electronic part inside the through hole penetrating the wiring board in the thickness direction while maintaining the substantially constant opening area. Said differently, if a mounter having a high accuracy is used to accommodate the electronic part, the electronic part is accurately mounted into the through hole. If a mounter having a low accuracy is used to accommodate the electronic part, the electronic part is not accurately mounted into the through hole. Specifically, there are problems that an electronic part is obliquely accommodated into a through hole, an electronic part is not accommodated into a through hole because of being prevented from being inserted into the through hole (the electronic part contacts an edge of the through hole so as to be dropped off), and so on.

SUMMARY

According to an aspect of the embodiment, a wiring board includes a core layer; a through hole penetrating through the core layer in a thickness direction of the core layer; and an electronic part accommodated inside the through hole, wherein the through hole includes a first opening portion provided on a first surface of the core layer, a second opening portion provided on a second surface of the core layer, and an inward protruding portion inwardly protruding relative to the first and second opening portions, and wherein the electronic part is held by the inward protruding portion.

The object and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

DESCRIPTION OF EMBODIMENTS

Hereinafter, preferred embodiments of the present invention are explained with reference to accompanying drawings. Where the same reference symbols may be attached to the same parts, and repeated description of the parts may be omitted.

[Structure of the Wiring Board of the First Embodiment]

Figure 1:
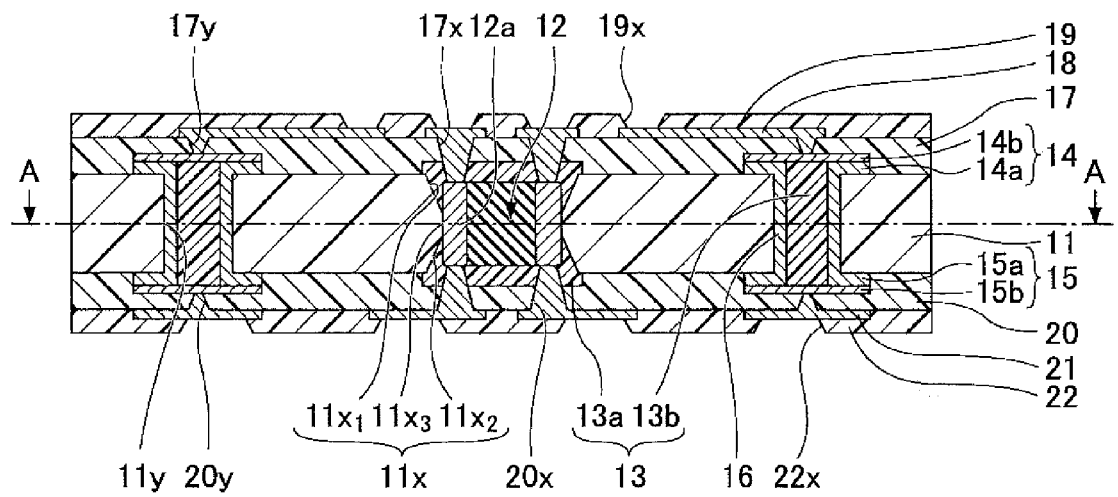
FIG. 1 illustrates an exemplary wiring board of the first embodiment.
Figure 1:
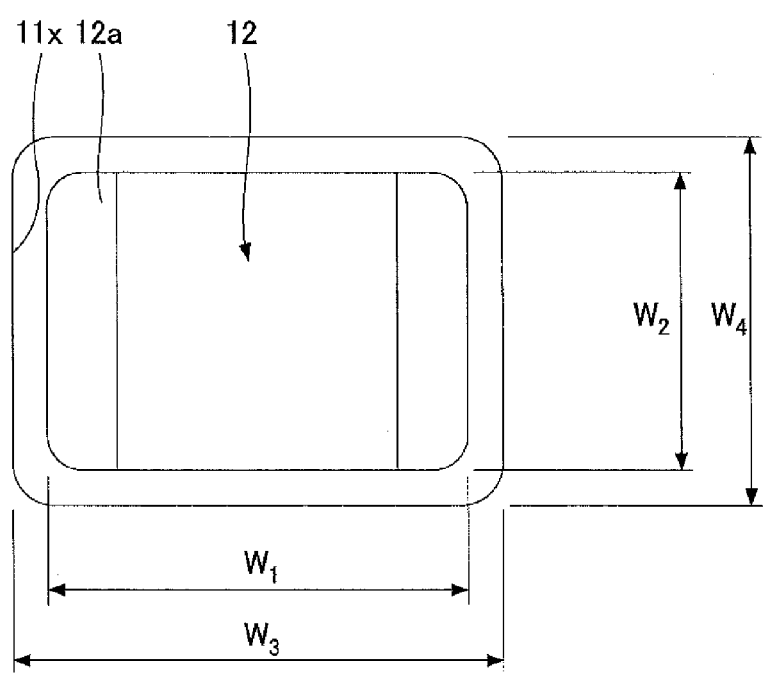

The structure of the wiring board of the first embodiment is described. FIG. 1 illustrates an exemplary wiring board of the first embodiment. In FIG. 1, (a) is a cross-sectional view and (b) is a plan view enlarging a vicinity of an electronic part of (a) of FIG. 1. Referring to (b) of FIG. 1, illustration of portions other than a through hole 11x and an electronic part 12 is omitted.

Referring to FIG. 1, the wiring board 10 includes a core layer 11, an electronic part 12, a resin part 13, a wiring layer 14, a wiring layer 15, through wiring 16, an insulating layer 17, a wiring layer 18, a solder resist layer 19, an insulating layer 20, a wiring layer 21, and a solder resist layer 22.

In the wiring board 10, for convenience, a side, on which the solder resist layer 19 is formed, is referred to as a first side (a first surface), and a side, on which the solder resist layer 22 is formed, is referred to as a second side (a second surface).

In the vicinity of the middle of the wiring board 10, the core layer 11 is provided. For example, a so-called glass epoxy board or the like may be used as the core layer 11. The core layer 11 may be a board made of a fabric or nonwoven fabric cloth such as a glass fiber, a carbon fiber, an aramid fiber or the like, which is impregnated with an epoxy resin or the like. The thickness of the core layer 11 is, for example, about 0.2 mm to about 1.0 mm.

The through hole 11x penetrating through the core layer 11 in the thickness direction is formed in the core layer 11. The electronic part 12 having an electrode 12a is accommodated inside the through hole 11x. A resin part fills a space between the through hole 11x and a periphery of the electronic part 12. The resin part 13a includes protrusions protruding from first and second surfaces of the core layer 11, respectively. The material of the resin portion 13a is, for example, an insulative resin such as an epoxy resin.

The electronic part 12 is, for example, a capacitor. An example of the capacitor is a ceramic chip capacitor. For example, the ceramic chip capacitor may be shaped like a rectangular parallelepiped having electrodes on both ends of a capacitor body in the longitudinal direction.

A plan view of the electronic part 12 is shaped like, for example, a rectangle. The size of the electronic part 12 is about 1.0 mm (width $W_1$)×0.5 mm (length $W_2$). The thickness of the electronic part 12 is, for example, about 0.2 mm to about 1.0 mm. However, the electronic part 12 is not limited to the capacitor and may be an inductor, a resistor, a thermistor, a crystal oscillator, a semiconductor element, or the like. The electronic part 12 is not limited to a mode where two electrodes 12a are provided. Three or more electrodes may be provided in the electronic part 12.

The through hole 11x includes a first hole $11x_1$ formed from the first surface of the core layer 11 and a second hole $11x_2$ formed from the second surface of the core layer 11. The first hole $11x_1$ is shaped like an inverted trapezium in its cross-sectional shape taken along the thickness directions where the area of the opening portion (the wide side) on the side of the first surface of the core layer 11 is greater than the area of the apex portion (the narrow side) formed inside the core layer 11. The second hole $11x_2$ is shaped like a trapezium in its cross-sectional shape taken along the thickness directions where the area of the opening portion (the wide side) on the side of the second surface of the core layer 11 is greater than the area of the apex portion (the narrow side) formed inside the core layer 11.

The apex portions of the first and second holes $11x_1$ and $11x_2$ communicate each other inside the core layer 11 (for example, in the vicinity of a middle portion of the core layer 11 in the thickness directions). The communicating portion between the apex portions of the first and second holes $11x_1$ and $11x_2$ forms an inward protruding portion $11x_3$ where an inner wall surface of the core layer 11 protrudes inside more than the opening portions on the first surface side and the second surface side. The inward protruding portion $11x_3$ is shaped like a ring.

The inward protruding portion $11x_3$ is provided on the inner wall surface of the through hole 11x in the middle in the thickness directions of the core layer 11. In this description of the invention, the "middle" means a range of ±20% from the center of the core layer 11 in the thickness direction. The inward protruding portion $11x_3$ is provided on the inner wall surface of the through hole 11x positioned within the range of ±20% from the center of the core layer 11 in its thickness directions.

Said differently, in the through hole 11x, the cross-sectional areas parallel to the first and second surfaces of the core layer 11 continuously decrease from the opening portions of the first and second surfaces to the inward protruding portion $11x_3$. In the through hole 11x, the cross-sectional area of the inward protruding portion $11x_3$ is the smallest (a small area portion).

Said differently, the cross-sectional view of the through hole 11x along the thickness directions includes a slant surface (line) from the opening portion on the first surface of the core layer 11 to the inward protruding portion $11x_3$ (small area portion) and a slant surface (line) from the opening portion on the second surface of the core layer 11 to the inward protruding portion $11x_3$ (small area portion).

In the through hole 11x, the planar shapes of the opening portions of the core layer 11 on the first and second surface sides can be arbitrarily determined. Because the through hole 11x is to accommodate the electronic part 12, the planar shape of the through hole 11x may be substantially similar to the planar shape of the electronic part 12. For example, if the planar shape of the electronic part 12 is substantially rectangular, the planar shape of the through hole 11x may be substantially rectangular.

However, in order to enable the electronic part 12 to be inserted into the through hole 11x, the planar shapes of the opening portions on the first and second surface sides of the through hole 11x are made greater than the planar shape of the electronic part. The planar shapes of the opening portions of the through hole 11x in the core layer 11 on the first and second surface sides are, for example, rectangular. The sizes are, for example, about 1.5 mm (width $W_3$)×1.0 mm (length $W_4$). In this case, ring-like gaps of about 0.25 mm in their plan views are formed between the opening portions of the through hole 11x in the core layer 11 on the first and second surface sides and outer peripheries of the electronic parts 12, respectively.

The inward protruding portion $11x_3$ of the through hole 11x contacts the side surface of the electronic part 12 along a ring-like contact portion to hold the electronic part 12. As clarified in the explanation of the manufacturing process of the wiring board 10 to be described below, the planar shape of the inside of the inward protruding portion $11x_3$ is formed to be smaller than the planar shape of the electronic part 12 before the electronic part 12 is inserted into the through hole 11x. Therefore, when the electronic part 12 is inserted into the through hole 11x and pressed, the inward protruding portion 11x3 of the through hole 11x is deformed so as to contact the side surface of the electronic part 12 along the ring-like contact portion to hold the electronic part 12.

Further, the inward protruding portion $11x_3$ of the through hole 11x is positioned in the vicinity of the middle portion of the core layer 11 in the thickness direction. However, the inward protruding portion $11x_3$ may be shifted towards the first or second side of the core layer 11 from the middle portion. Said differently, the inward protruding portion $11x_3$ may somewhat shift along the thickness direction (a perpendicular direction) from the middle portion of the core layer 11 in the thickness directions.

Further, an axis of the first hole $11x_1$ or an axis of the second hole $11x_2$ may somewhat shift in horizontal directions. Further, as long as there is no trouble in inserting the electronic part 12 (see (a) of FIG. 3), the area of the opening portion of the first hole $11x_1$ and the area of the opening portion of the second hole $11x_2$ may somewhat differ.

Further, the cross-sectional shape of the through hole 11x in the thickness directions from the opening portion on the first side to the inward protruding portion $11x_3$ may be straight or curved. Further, the cross-sectional shape of the through hole 11x in the thickness directions from the opening portion on the second side to the inward protruding portion $11x_3$ may be straight or curved.

Within the first embodiment, the planar shape of the through hole 11x is substantially similar to the planar shape of the electronic part 12. However, the planar shape of the through hole 11x may be shaped like a circle, an ellipse, or the like. In this case, a part of the corners and the side surfaces of the electronic part 12 may contact the inward protruding portion $11x_3$ of the through hole 11x shaped like the circle, the ellipse, or the like.

The wiring layer 14 including a first metallic layer 14a and a second metallic layer 14b is formed on the first surface of the core layer 11. The wiring layer 15 including a third metallic layer 15a and a fourth metallic layer 15b is formed on the second surface of the core layer 11. For example, the thicknesses of the first and second wiring layers 14 and 15 are, for example, about 10 to 20 μm. The first and second wiring layers 14 and 15 are patterned to have predetermined planar shapes. The first and second wiring layers 14 and 15 are electrically connected by the through wiring 16 formed on an inner wall surface of the through hole 11y, which penetrates the core layer 11 in its thickness directions.

The first metallic layer 14a of the first wiring layer 14, the third metallic layer 15a of the second wiring layer 15, and the through wiring 16 are integrally formed so that the first metallic layer 14a of the first wiring layer 14 is electrically connected to the third metallic layer 15a of the second wiring layer 15 via the through hole 11y. For convenience, the through wiring 16 corresponds to a part formed inside the through hole 11x. Further, in the following explanation, the first metallic layer 14a of the wiring layer 14 is on a side of the insulating layer 17 relative to the through wiring 16, and the third metallic layer 15a of the wiring layer 15 is on a side of the insulating layer 20 relative to the through wiring 16.

A resin part 13b fills an inside of the through wiring 16 formed inside the through hole 11y. The resin part 13b protrudes from the first surface of the core layer 11. A first surface of the resin part 13b is arranged substantially on the same plane as that of a first surface of the first metallic layer 14a. The second metallic layer 14b is formed so as to coat a first surface of the resin part 13b and the first surface of the first metallic layer 14a. Further, the first surface of the resin part 13b is arranged substantially on the same plane as that of the first surface of the resin part 13a.

The resin part 13b protrudes from the second surface of the core layer 11. A second surface of the resin part 13b is arranged substantially on the same plane as that of a second surface of the third metallic layer 15a. The fourth metallic layer 15b is formed so as to coat the second surface of the resin part 13b and the second surface of the third metallic layer 15a. Further, the second surface of the resin part 13b is arranged substantially on the same plane as that of the second surface of the resin part 15a.

Materials of the first metallic layer 14a, the second metallic layer 14b, the third metallic layer 15a, the fourth metallic layer 15b, and the through wiring 16 are, for example, copper (Cu) or the like. The material of the resin portion 13b is, for example, an insulative resin whose major component is an epoxy resin or the like. The resin parts 13a and 13b may be collectively referred to as a resin part 13.

The insulating layer 17 is formed to coat the wiring layer 14, the protruding portion of the resin part 13a, and the first surface of the core layer 11. The material of the insulating layer 17 may be a thermosetting insulating resin containing an epoxy resin as a major component or the like. The material of the insulating layer 17 may be, for example, a thermosetting insulating resin containing an polyimide resin as a major component or the like. The insulating layer 17 may be made of a fabric cloth or a nonwoven fabric cloth such as a glass fiber or a carbon fiber, each impregnated with a thermosetting epoxy or polyimide resin.

The insulating layer 17 may contain a filler made of silica ($SiO_2$) or the like. The thickness of the insulating layer 17 is, for example, about 15 to 35 μm. The insulating layer 17 is a typical example of an insulating layer of the first embodiment.

The insulating layer 17 and the resin part 13a are formed with a via hole 17x penetrating through the insulating layer 17 and the resin part 13a so that the electrode 12a of the electronic part 12 is exposed inside the via hole 17x. Further, a via hole 17y is formed to penetrate through the insulating layer 17 and expose the first surface of the wiring layer 14. The via hole 17x is opened on the side of the solder resist layer 19. The bottom surface of the via hole 17x is formed by the electrode 12a of the electronic part 12. The via hole 17x is a recess shaped like a circular truncated cone, in which the area of the opening portion is greater than the area of the bottom surface. A via hole 17y is opened on the side of the solder resist layer 19. The bottom surface of the via hole 17y is formed by the first surface of the wiring layer 14. The via hole 17y is a recess shaped like a circular truncated cone, in which the area of the opening portion is greater than the area of the bottom surface.

The wiring layer 18 is formed on the first side of the insulating layer 17. The wiring layer 18 includes via wiring filling the inside of the via hole 17x, via wiring filling the inside of the via hole 17y, and a wiring pattern formed on the first surface of the insulating layer 17. The via wiring filling the inside of the via hole 17x is electrically directly connected to the electrode 12a of the electronic part 12. The via wiring filling the inside of the via hole 17y is electrically directly connected to the wiring layer 14. The material of the wiring layer 18 is, for example, copper (Cu) or the like. For example, the thicknesses of the wiring layer 18 may be about 10 to 20 μm. The wiring layer 18 is a typical example of a wiring layer of the first embodiment.

The solder resist layer 19 is formed to coat the wiring layer 18 on the first surface of the insulating layer 17. The solder resist layer 19 may be formed of, for example, a photosensitive resin or the like. The thickness of the solder resist layer 19 may be, for example, about 15 to 35 μm.

The solder resist layer 19 includes an opening portion 19x, and a part of the wiring layer 18 is exposed inside the opening portion 19x. The wiring layer 18 exposed inside the opening portion 19x functions as a pad, which is to be electrically connected to a semiconductor chip (not illustrated). Hereinafter, the wiring layer 18 exposed inside the opening portion 19x may be referred to as a first pad 18.

When necessary, a metallic layer may be formed on the first surface of the first pad 18, or an oxidation resistant process such as Organic Solderability Preservative (OSP) or the like may be provided. An example of the metallic layer is an Au layer, a Ni/Au layer, which is a metallic layer formed by laminating a Ni layer and an Au layer in this order, a Ni/Pd/Au layer, which is a metallic layer formed by laminating a Ni layer, a Pd layer, and an Au layer in this order or the like. The thickness of the metallic layer may be about 0.03 to 10 μm.

The insulating layer 20 is formed to coat the wiring layer 15, the protruding portion of the resin part 13a, and the second surface of the core layer 11. For example, the material and the thickness of the insulating layer 20 may be similar to those of the insulating layer 17. The insulating layer 20 may contain a filler made of silica ($SiO_2$) or the like. The insulating layer 20 is a typical example of an insulating layer of the first embodiment.

The insulating layer 20 and the resin part 13a are formed with a via hole 20x penetrating through the insulating layer 20 and the resin part 13a so that the electrode 12a of the electronic part 12 is exposed inside the via hole 20x. Further, a via hole 20y is formed to penetrate through the insulating layer 20 and to expose the first surface of the wiring layer 15. The via hole 20x is opened on the side of the solder resist layer 22. The bottom surface of the via hole 20x is formed by the electrode 12a of the electronic part 12. The via hole 20x is a recess shaped like a circular truncated cone, in which the area of the opening portion is greater than the area of the bottom surface. A via hole 20y is opened on the side of the solder resist layer 22. The bottom surface of the via hole 20y is formed by the first surface of the wiring layer 15. The via hole 20y is a recess shaped like a circular truncated cone, in which the area of the opening portion is greater than the area of the bottom surface.

The wiring layer 21 is formed on the second side of the insulating layer 20. The wiring layer 21 includes via wiring filling the inside of the via hole 20x, via wiring filling the inside of the via hole 20y, and a wiring pattern formed on the second surface of the insulating layer 20. The via wiring filling the inside of the via hole 20x is electrically directly connected to the electrode 12a of the electronic part 12. Said differently, the wiring layer 21 is electrically connected to the wiring layer 18 via the electrode 12a of the electronic part 12. Further, the via wiring filling the inside of the via hole 20y is electrically directly connected to the wiring layer 15. For example, the material and the thickness of the wiring layer 21 may be similar to those of the wiring layer 18. The wiring layer 21 is a typical example of another wiring layer of the first embodiment.

The solder resist layer 22 is formed to coat the wiring layer 21 on the second surface of the insulating layer 20. The solder resist layer 22 may be formed of, for example, a photosensitive resin or the like. The thickness of the solder resist layer 22 may be, for example, about 15 to 35 µm.

The solder resist layer 22 includes an opening portion 22x, and a part of the wiring layer 21 is exposed inside the opening portion 22x. The wiring layer 21 exposed inside the opening portion 22x functions as a pad, which is to be electrically connected to a mounting board (not illustrated) such as a motherboard. Hereinafter, the wiring layer 21 exposed inside the opening portion 22x may be referred to as a second pad 21.

When necessary, a metallic layer may be formed on the second surface of the second pad 21, or an oxidation resistant process such as Organic Solderability Preservative (OSP) or the like may be provided. An example of the metallic layer is an Au layer, a Ni/Au layer, which is a metallic layer formed by laminating a Ni layer and an Au layer in this order, a Ni/Pd/Au layer, which is a metallic layer formed by laminating a Ni layer, a Pd layer, and an Au layer in this order or the like. The thickness of the metallic layer may be about 0.03 to 10 µm.

[Method of Manufacturing the Wiring Substrate of the First Embodiment]

Next, the method of manufacturing the wiring substrate of the first embodiment is described. FIG. 2 to FIG. 5 illustrate exemplary manufacturing steps of the wiring board of the first embodiment.

Figure 2:
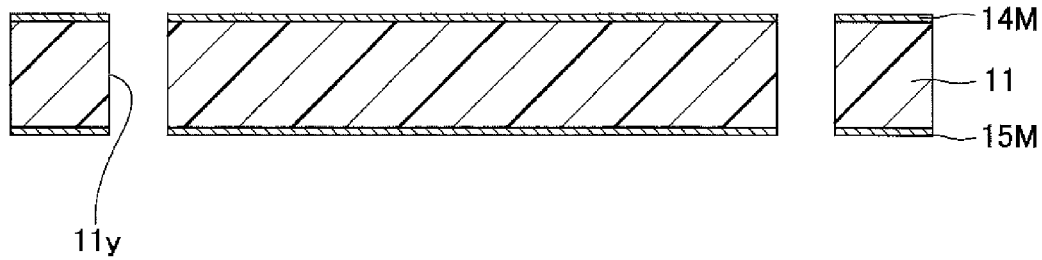
FIG. 2 illustrates an exemplary manufacturing process of a wiring board of a first embodiment.
Figure 2:
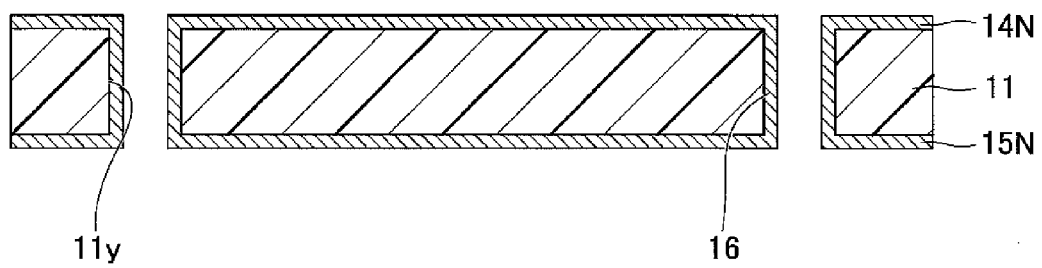
Figure 2:
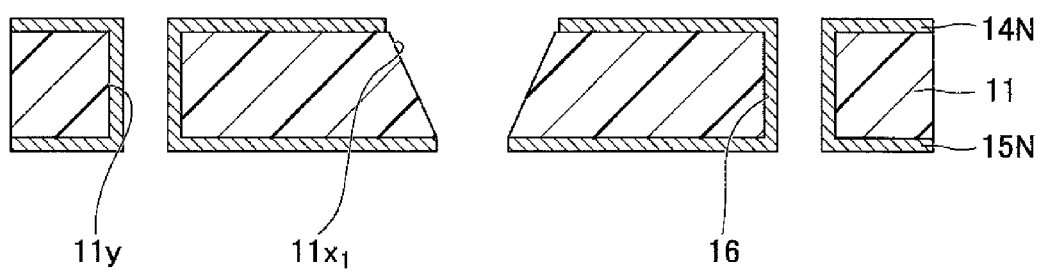
Figure 2:
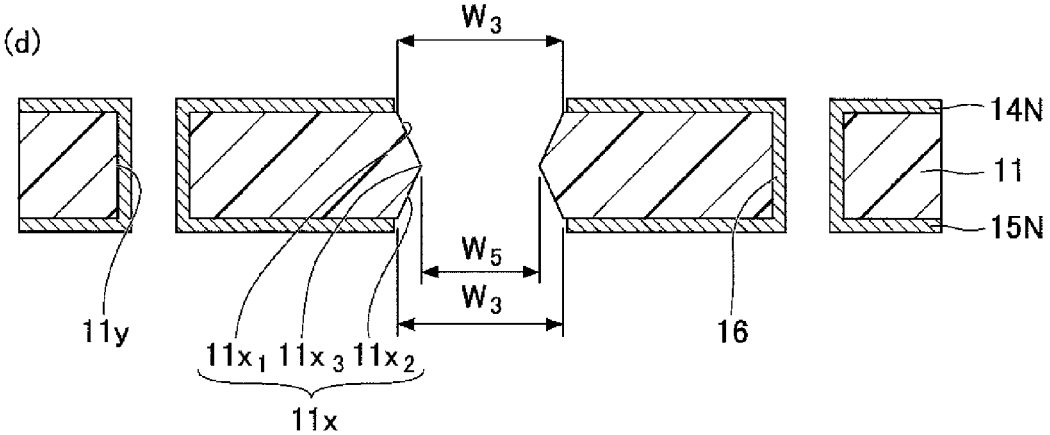

Referring to (a) of FIG. 2, a laminated plate includes a first metallic foil 14M (i.e., a plane metallic foil which is not patterned) formed on the first surface of the core layer 11 and a second metallic foil 15M (i.e., a plane metallic foil which is not patterned) formed on the second surface of the core layer. The laminated plate is prepared. However, instead of the laminated plate including the first metallic foil 14M and the second metallic foil 15M, the core layer 11, which is not provided with a metallic foil, may be prepared at first.

For example, a so-called glass epoxy board, which is formed by impregnating an epoxy resin with a glass cloth, or the like may be used as the core layer 11. The core layer 11 may be a board made of a fabric or nonwoven fabric cloth such as a glass fiber, a carbon fiber, an aramid fiber or the like, which is impregnated with an epoxy resin, a polyimide resin or the like. The thickness of the core layer 11 is, for example, about 0.2 to 1.0 mm. For example, the first metallic foil 14M and the second metallic foil 15M are copper foils. For example, the thicknesses of the first metallic foil 14M and the second metallic foil 15M are about 12 to 40 µm.

Then, the through hole 11y penetrating through the first metallic foil 14M, the core layer 11, and the second metallic foil 15M is formed on the laminated plate as described above. The through hole 11y may be mechanically formed by, for example, a drill or the like. The diameter of the through hole 11x is, for example, about 80 to 250 µm. After forming the through hole 11y, desmear is preferably performed to remove residue of a resin contained in the core layer 11 attached to the inner wall surface of the through hole 11y.

In the process illustrated in (b) of FIG. 2, the through wiring 16 is formed so as to coat the inner wall surface of the through hole 11y. For example, the through wiring 16 can be formed as follows. At first, by electroless plating or the like, a first conductive layer coating the first surface of the first metallic foil 14M, the inner wall surface of the through hole 11y, and the second surface of the second metallic foil 15M is formed. Next, a second conductive layer is formed by electro plating using the first conductive layer as a power supply layer. Thus, the through wiring 16, which is made of the first conductive layer and the second conductive layer and coats the inner wall surface of the through hole 11y, is formed inside the through hole 11y. The materials of the first and second conductive layers are, for example, copper or the like.

Although the first conductive layer and the second conductive layer are formed on the first surface of the first metallic foil 14M and the second surface of the second surface of the second metallic foil 15M, the first and second conductive layers will be patterned in the later processes and will be parts of the wiring layers 14 and 15. Referring to (b) of FIG. 2, for simplification of the figure, the first metallic foil 14M, the first conductive layer, and the second conductive layer are inclusively referred to as a metallic layer 14N. Similarly, the second metallic foil 15M, the first conductive layer, and the second conductive layer are inclusively referred to as a metallic layer 15N. The other figures are illustrated in a manner similar thereto.

Referring to (c) and (d) of FIG. 2, the through hole 11x is formed to penetrate the metallic layer 14N, the core layer 11, and the metallic layer 15N. In order to form the through hole 11x, as illustrated in (c) of FIG. 2, the metallic layer 14N on the first surface side of the core layer 11 is irradiated by ultraviolet (UV) laser to thereby form the first hole $11x_1$ on the first surface side of the core layer 11. A wavelength range of the ultraviolet laser is preferably about 200 to 400 nm.

However, the diameter of the opening portion formed by once irradiating the ultraviolet laser (UV laser) is about 5 µm at maximum. Therefore, it is necessary to irradiate the ultraviolet (UV) laser more than one time to make the planar shape of the opening portion of the through hole 11x in the core layer 11 on its first surface side, for example, about 1.5 mm (width $W_3$)×1.0 mm (length). Said differently, a plurality of irradiations of the ultraviolet laser is done to form a plurality of through holes so as to communicate one another thereby obtaining an opening portion having a predetermined shape.

The first hole $11x_1$ is shaped like an inverted trapezium (a tapered structure) in its cross-sectional shape taken along the thickness directions where the area of the opening portion on the side of the first surface of the core layer 11 is greater than the area of an opening portion on the side of the second surface of the core layer 11. However, if the through hole 11x is finally formed, the first hole $11x_1$ needs not to penetrate through the core layer 11 in the process illustrated in (c) of FIG. 2. In this case, the first hole $11x_1$ is shaped like an inverted trapezium (the tapered structure) in its cross-sectional shape taken along the thickness directions where the area of the opening portion on the side of the first surface of the core layer 11 is greater than the area of the apex portion formed inside the core layer 11.

Next, referring to (d) of FIG. 2, the metallic layer 15N on the second surface of the core layer 11 is irradiated by the ultraviolet (UV) laser at a position corresponding to the first hole $11x_1$ to thereby form a second hole $11x_2$ on the second side of the core layer 11. The second hole $11x_2$ is shaped like a trapezium in its cross-sectional shape taken along the thickness directions where the area of the opening portion on the side of the second surface of the core layer 11 is greater than the area of the apex portion formed inside the core layer 11. In the second hole $11x_2$, the metallic layer 15N on the second surface of the core layer 11 is irradiated by the ultraviolet (UV) laser more than one time so that a plurality of through holes are mutually communicated in forming the opening portion having a predetermined shape. This is similar to the first hole $11x_1$.

Referring to (d) of FIG. 2, the apex portion of the first hole $11x_1$ and the apex portion of the second hole $11x_2$ communicate in the vicinity of a middle of the core layer 11 in the thickness directions thereby forming the through hole $11x$. The communicating portion between the apex portions of the first and second holes $11x_1$ and $11x_2$ forms the inward protruding portion $11x_3$ where an inner wall surface of the core layer 11 protrudes inside more than the opening portions on the first surface side and the second surface side. The inward protruding portion $11x_3$ is shaped like the ring.

The inclined angle of the inner wall surface of the first hole relative to the first surface of the core layer 11 and the inclined angle of the inner wall surface of the second hole relative to the second surface of the core layer 11 may be appropriately determined so that the electronic part 12 can be easily inserted. For example, the inclined angle is about 60° to about 85°. The inclined angles of the inner wall surfaces can be adjusted by optimizing the power, the focal length, or the like of the irradiated laser beam.

After the process illustrated in (d) of FIG. 2, desmear is conducted to remove residue of the resin contained in the core layer 11 attached to the inner wall surface of the through hole $11x$.

In the process illustrated in (d) of FIG. 2, the planar shapes of the opening portions of the through hole $11x$ on the sides of the first and second surfaces have sizes greater than the size of the planar shape of the electronic part 12 to be inserted in the process described later. The planar shapes of the opening portions of the through hole $11x$ in the core layer 11 on the first and second surface sides are, for example, rectangular. The sizes are, for example, about 1.5 mm (width $W_3$)×1.0 mm (length).

Further, in the process illustrated in (d) of FIG. 2, the planar shape of the inner region of the inward protruding portion $11x_3$ is made smaller than the planar shape of the electronic part 12 inserted in the process described later. For example, in the planar shape of the inside area of the inward protruding portion $11x_3$, the width W5 is made about 200 to 400 μm smaller than the width W1 of the electronic part 12.

For example, in the planar shape of the inside area of the inward protruding portion $11x_3$, the length (in the direction perpendicular to the cross-sectional shape of (d) of FIG. 2) is made about 200 to 400 μm smaller than the length W2 of the electronic part 12. However, an extent to which the planar shape of the inside area of the inward protruding portion $11x_3$ is made smaller than the planar shape of the electronic part 12 can be appropriately determined in consideration of hardness or the like of an insulating resin forming the core layer 11.

Further, the inward protruding portion $11x_3$ of the through hole $11x$ is positioned in the vicinity of the middle portion of the core layer 11 in the thickness directions. However, the inward protruding portion $11x_3$ may shift on the first or second side of the core layer 11 from the middle portion. Said differently, the inward protruding portion $11x_3$ may somewhat shift along the thickness direction (the perpendicular directions) from the middle portion of the core layer 11 in the thickness directions. Further, the axis of the first hole $11x_1$ or the axis of the second hole $11x_2$ may somewhat shift in horizontal directions. Further, as long as there is no trouble in inserting the electronic part 12 (see (a) of FIG. 3), the area of the opening portion of the first hole $11x_1$ and the area of the opening portion of the second hole $11x_2$ may somewhat differ.

Further, the cross-sectional shape of the through hole $11x$ in the thickness directions from the opening portion on the first side to the inward protruding portion $11x_3$ may be straight or curved. Further, the cross-sectional shape of the through hole $11x$ in the thickness directions from the opening portion on the second side to the inward protruding portion $11x_3$ may be straight or curved. Within the first embodiment, the planar shape of the through hole $11x$ is substantially similar to the planar shape of the electronic part 12. However, the planar shape of the through hole $11x$ may be shaped like a circle, an ellipse, or the like.

Further, the reason why the ultraviolet (UV) laser is used in (c) and (d) of FIG. 2 is that the ultraviolet (UV) laser can penetrate through a metal with relatively small emission power since a rate of absorption of light in a wavelength range of the ultraviolet (UV) laser is high. Because copper has an especially high rate of absorption of the light in the wavelength range of the ultraviolet (UV) laser, copper can be effectively used as the materials of the metallic layers 14N and 15N.

Figure 3:
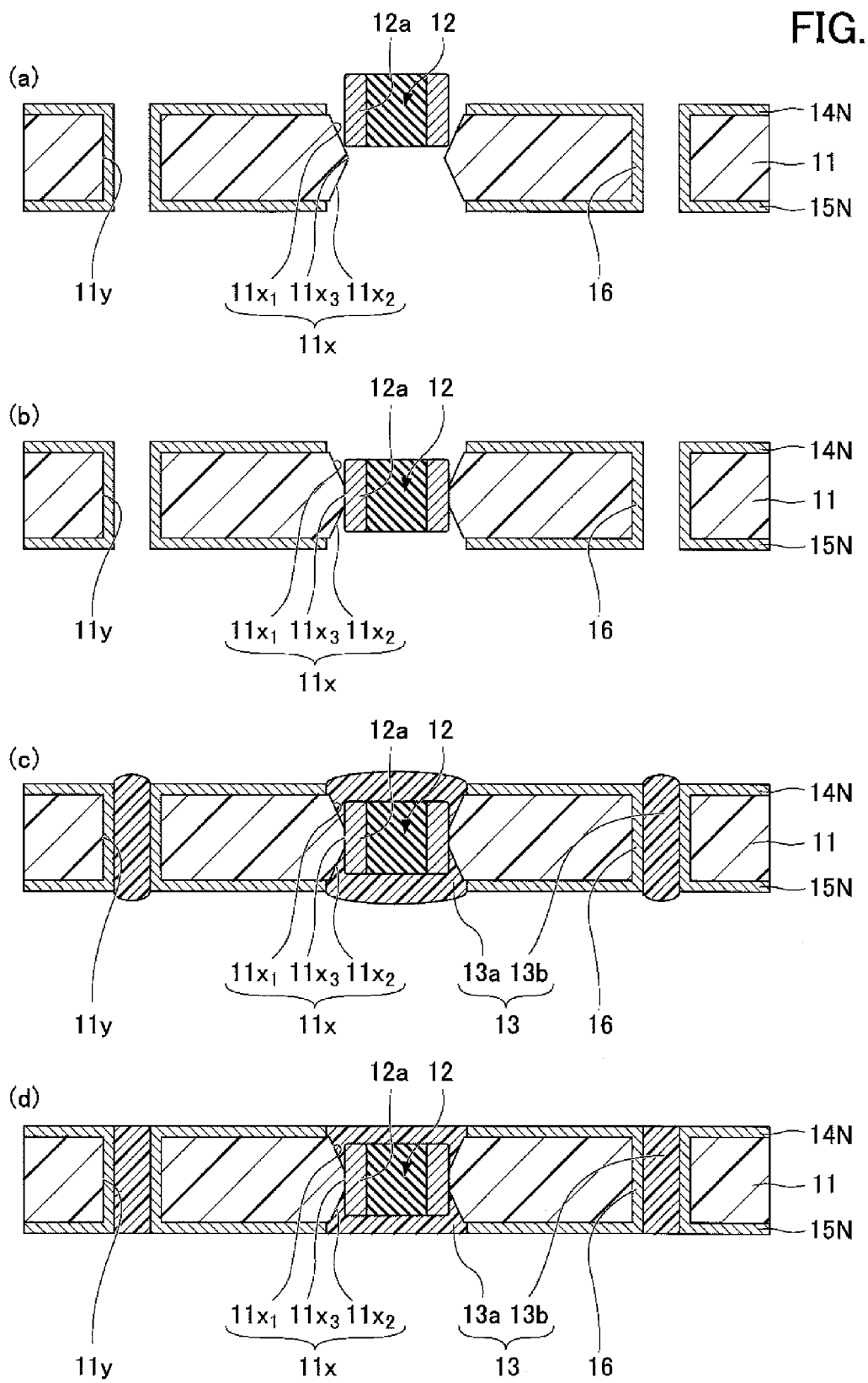
FIG. 3 illustrates the exemplary manufacturing process of the wiring board of the first embodiment.

Referring to (a) of FIG. 3, the electronic part 12 is inserted (provisionally arranged) inside the through hole $11x$. The electronic part 12 can be inserted into (provisionally arranged in) the wiring board 10 using a mounter for the electronic part. As described, since the planar shape of the inside area of the inward protruding portion $11x_3$ is formed to be smaller than the planar shape of the electronic part 12 to be inserted, the electronic part 12 is provisionally arranged on the inward protruding portion $11x_3$.

As described above, the planar shapes of the opening portions of the through hole $11x$ on the sides of the first and second surfaces have sizes greater than the size of the planar shape of the electronic part 12 to be inserted in the process described later. Said differently, a part where the electronic part 12 in inserted into the through hole $11x$ is shaped like a taper. Therefore, even if the mounting position of the electronic part 12 using the mounter is shifted from the center of the through hole $11x$, the electronic part 12 is guided by the taper shape of the through hole $11x$ so as to be accurately inserted into (provisionally arranged in) the through hole $11x$.

Next, in the process of (b) of FIG. 3, the electronic part 12 is pressed onto the side of the inward protruding portion $11x_3$. Thus, the inward protruding portion $11x_3$ of the through hole $11x$ contacts the side surface of the electronic part 12 along the ring-like contact portion to hold the electronic part 12. Said differently, the inward protruding portion $11x_3$ becomes a supporting point for press-fitting the electronic part 12 to thereby fix the electronic part 12 inside the through hole $11x$.

Next, in the process illustrated in (c) and (d) of FIG. 3, the resin part 13 including the resin parts 13a and 13b is formed. In forming the resin part 13a, as illustrated in (c) of FIG. 3, the insulating resin, whose major component is an epoxy resin, or the like is inpoured around the electronic part 12 inside the through hole $11x$. Further, the insulating resin or the like is protruded from the first surface of the metallic layer 14N and the second surface of the metallic layer 15N. Thereafter, the insulating resin or the like is hardened by heating.

In forming the resin part 13b, as illustrated in (c) of FIG. 3, the insulating resin, whose major component is an epoxy resin, or the like is inpoured inside the through wiring 16 formed inside the through hole $11x$. Further, the insulating resin or the like is protruded from the first surface of the metallic layer 14N and the second surface of the metallic layer 15N. Thereafter, the insulating resin or the like is hardened by heating.

As illustrated in (d) of FIG. 3, the insulating resin or the like protruding from the first surface of the metallic layer 14N and the second surface of the metallic layer 15N is polished to smooth. Thus, the first surfaces of the resin parts 13a and 13b are arranged substantially on the same plane as that of the first surface of the metallic layer 14N. The second surfaces of the resin parts 13a and 13b are arranged substantially on the same plane as that of the second surface of the metallic layer 15N.

Figure 4:
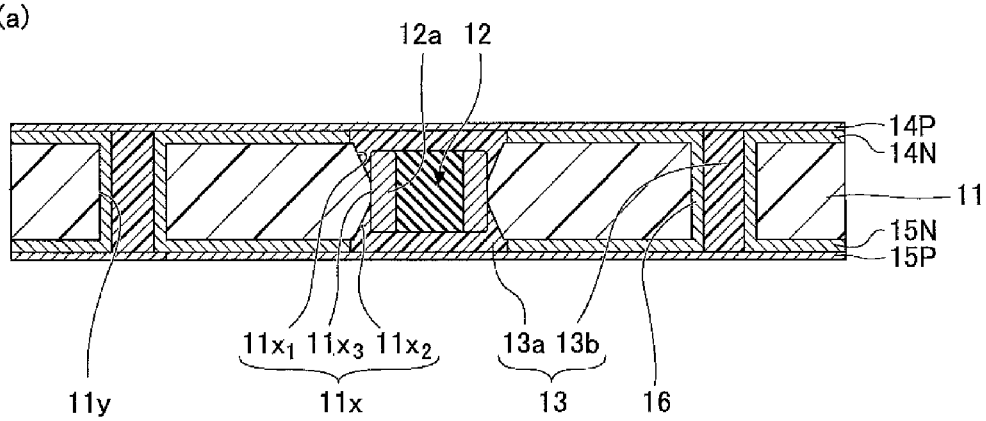
FIG. 4 illustrates the exemplary manufacturing process of the wiring board of the first embodiment.
Figure 4:
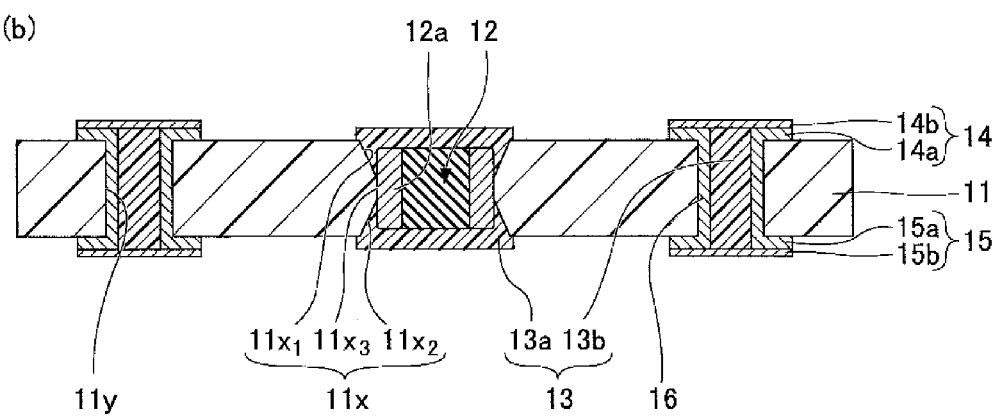
Figure 4:
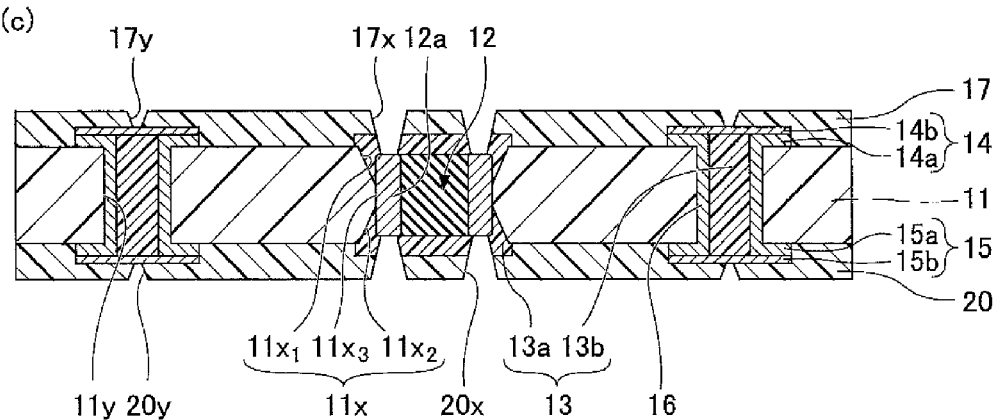

In the process illustrated in (a) of FIG. 4, the metallic layer 14P coating the first surface of the resin part 13a, the first surface of the resin part 13b, and the first surface of the metallic layer 14N is formed. Further, the metallic layer 15P coating the second surface of the resin part 13a, the second surface of the resin part 13b, and the second surface of the metallic layer 15N is formed. The materials of the metallic layers 14P and 15P are, for example, copper or the like. The thicknesses of the metallic layers 14P and 15P are, for example, about 15 to 45 µm.

For example, the metallic layer 14P can be formed as follows. At first, a third conductive layer coating the first surface of the resin part 13a, the first surface of the resin part 13b, and the first surface of the metallic layer 14N is formed by electroless plating or the like. Next, a fourth conductive layer is formed by electro plating using the third conductive layer as a power supply layer.

Thus, the metallic layer 14P is made of the third conductive layer and the fourth conductive layer to coat the first surface of the resin part 13a, the first surface of the resin part 13b, and the first surface of the metallic layer 14N. The metallic layer 15P can be formed in a manner similar to the metallic layer 14P. Referring to (a) of FIG. 4, for simplification of the figure, the third and fourth conductive layers are integrally illustrated as the metallic layer 14P. The metallic layer 15P is similarly illustrated.

In the process illustrated in (b) of FIG. 4, the wiring layers 14 and 15 are formed. Specifically, a resist layer (not illustrated) is formed on the metallic layers 14N and 14P to coat a portion of the metallic layers 14N and 14P to be the wiring layer 14. The other portion of the metallic layers 14N and 14P, which is not coated by the resist layer (not illustrated), is removed by etching to thereby form the wiring layer 14 including the first and second metallic layers 14a and 14b. The first and second metallic layers 14a and 14b are formed by patterning the metallic layers 14N and 14P. The first end surface of the resin part 13a protrudes from the first surface of the core layer 11.

Further, a resist layer (not illustrated) is formed on the metallic layers 15N and 15P to coat a portion of the metallic layers 15N and 15P to be the wiring layer 15. The other portion of the metallic layers 15N and 15P, which is not covered by the resist layer (not illustrated), is removed by etching to thereby form the wiring layer 15 including the third and fourth metallic layers 15a and 15b. The third and fourth metallic layers 15a and 15b are formed by patterning the metallic layers 15N and 15P. The second end surface of the resin part 13a protrudes from the second surface of the core layer 11.

Next, in the process illustrated in (c) of FIG. 4, a film-like resin or the like is laminated on the first surface of the core layer 11 to coat the wiring layer 14 and the protruding portion of the resin part 13a thereby forming the insulating layer 17. Further, a film-like resin or the like is laminated on the second surface of the core layer 11 to coat the wiring layer 15 and the protruding portion of the resin part 13a thereby forming the insulating layer 20. The film-like resin is, for example, a thermosetting epoxy resin, a thermosetting polyimide resin, or the like.

Instead of the laminated film-like resin, a liquid-like or paste-like epoxy resin or the like may be used. Then, after the liquid-like or paste-like epoxy resin or the like is coated, the liquid-like or paste-like epoxy resin or the like may be hardened to form the insulating layers 17 and 20. The thicknesses of the insulating layers 17 and 20 are, for example, about 15 to 35 µm. The insulating layers 17 and 20 may contain a filler made of silica ($SiO_2$) or the like.

The insulating layer 17 and the resin part 13a are formed with a via hole 17x penetrating through the insulating layer 17 and the resin part 13a so that the electrode 12a of the electronic part 12 is exposed inside the via hole 17x. Further, the via hole 17y is formed to penetrate through the insulating layer 17 and expose the first surface of the wiring layer 14. The insulating layer 20 and the resin part 13a are formed with the via hole 20x penetrating through the insulating layer 20 and the resin part 13a so that the electrode 12a of the electronic part 12 is exposed inside the via hole 20x. Further, the via hole 20y is formed to penetrate through the insulating layer 20 and expose the first surface of the wiring layer 15.

The via holes 17x, 17y, 20x, and 20y can be formed by, for example, laser processing using $CO_2$ laser or the like. After forming the via holes 17x, 17y, 20x, and 20y, desmear is performed to remove residue of the resin attached onto the inner wall surfaces of the via holes 17x, 17y, 20x, and 20y.

Figure 5:
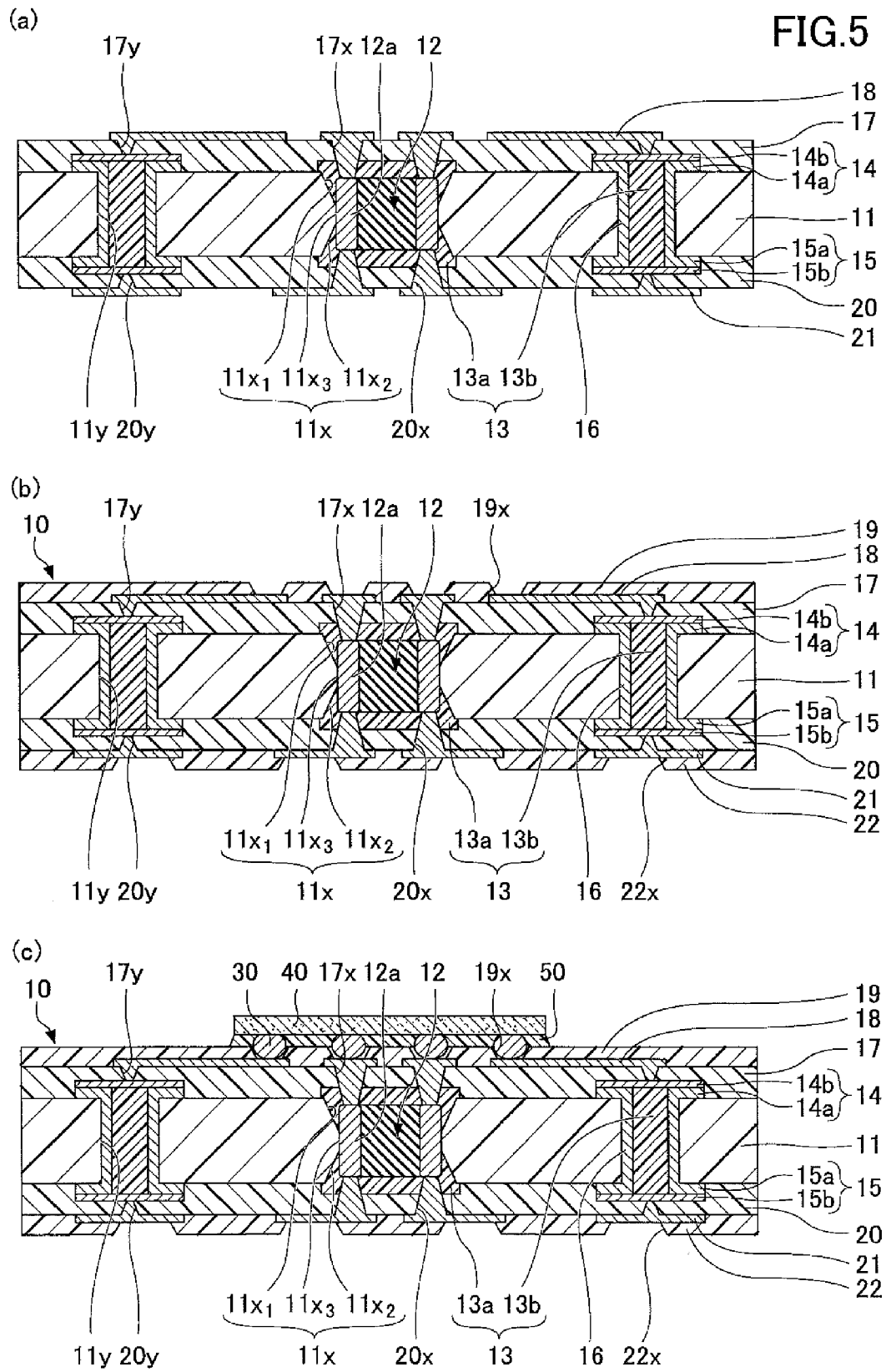
FIG. 5 illustrates the exemplary manufacturing process of the wiring board of the first embodiment.

In the process illustrated in (a) of FIG. 5, the wiring layer 18 is formed on the first side of the insulating layer 17. The wiring layer 18 includes via wiring filling the inside of the via hole 17x, via wiring filling the inside of the via hole 17y, and the wiring pattern formed on the first surface of the insulating layer 17. The via wiring filling the inside of the via hole 17x is directly electrically connected to the electrode 12a of the electronic part 12. The via wiring filling the inside of the via hole 17y is directly electrically connected to the wiring layer 14.

Similarly, the wiring layer 21 is formed on the second side of the insulating layer 20. The wiring layer 21 includes via wiring filling the inside of the via hole 20x, via wiring filling the inside of the via hole 20y, and the wiring pattern formed on the second surface of the insulating layer 20. The via wiring filling the inside of the via hole 20x is directly electrically connected to the electrode 12a of the electronic part 12. The via wiring filling the inside of the via hole 20y is directly electrically connected to the wiring layer 15.

The materials of the wiring layers 18 and 21 are, for example, copper (Cu) or the like. For example, the thicknesses of the first and second wiring layers 18 and 21 are, for example, about 10 to 20 µm. The wiring layers 18 and 21 may be formed by various wiring forming method such as a semi-additive method and a subtractive method. An arbitrary amount of insulating layers and an arbitrary amount of wiring layers may further be laminated on the wiring layer 18 or 21.

In the process illustrated in (b) of FIG. 5, the solder resist layer 19 is formed on the first surface of the insulating layer 17 to coat the wiring layer 18. The solder resist layer 19 may be formed by coating the wiring layer 18 with a liquid-like or paste-like photosensitive epoxy resin by a screen printing method, a roll coating method, a spin coat method or the like. For example, the solder resist layer 19 may be formed by laminating a film-like photosensitive epoxy insulating on the first surface of the insulating layer 17 so as to cover the wiring layer 18. Similarly, the solder resist layer 22 is formed to coat the wiring layer 21 on the second surface of the insulating layer 20.

By exposing the coated or laminated insulating resin to light and developing the coated or laminated insulating resin (photolithography), the opening portion $19x$ is formed in the solder resist layer 19. Further, the opening portion $22x$ is formed in the solder resist layer 22 (photolithography). The opening portions $19x$ and $22x$ may be formed by laser processing or blasting. The planar shapes of the opening portions $19x$ and $22x$ are, for example, a circle. The diameter of the opening portion $19x$ is, for example, about 50 to 100 μm. The diameter of the opening portion $22x$ is, for example, about 400 to 1200 μm.

When necessary, a metallic layer or the like may be formed on the first surface of the wiring layer 18 or the second surface of the wiring layer 21, respectively exposed inside the opening portion $19x$ or the opening portion $22x$, by, for example, electroless plating. An example of the metallic layer is an Au layer, a Ni/Au layer, which is a metallic layer formed by laminating a Ni layer and an Au layer in this order, a Ni/Pd/Au layer, which is a metallic layer formed by laminating a Ni layer, a Pd layer, and an Au layer in this order or the like. Instead, an oxidation resistant process such as Organic Solderability Preservative (OSP) or the like may be provided on the first surface of the wiring layer 18 or the second surface of the wiring layer 21, respectively exposed inside the opening portion $19x$ or the opening portion $22x$, instead of the formation of the metallic layer.

In the process illustrated in (b) of FIG. 5, the wiring board 10 is completed. Further, as illustrated in (c) of FIG. 5, a semiconductor chip 40 may be mounted on the wiring board 10 via a joining portion 30. An underfill resin 50 fills a gap between the wiring board 10 and the semiconductor chip 40 to obtain a semiconductor package. The joining portion 30 is, for example, a solder ball or the like. The material of the solder ball may be, for example, an alloy containing Pb, an alloy containing Sn and Cu, an alloy containing Sn and Ag, an alloy containing Sn, Ag, and Cu, or the like.

Referring to FIGS. 2 to 5, an example of forming a single wiring board 10 is described. However, after forming a member to be a plurality of wiring boards 10, the member is cut and diced to obtain a plurality of wiring boards 10. Further, a plurality of through holes for accommodating electronic parts may be formed in the wiring board 10, and the electronic parts may be accommodated inside the through holes. At this time, the same electronic parts may be accommodated inside the through holes. Alternatively, different electronic parts may be accommodated in the through holes.

As described, within the first embodiment, the through hole $11x$ including the inward protruding portion $11x_3$ is formed in the core layer 11. The inward protruding portion $11x_3$ is formed by the inner wall surface protruding inward from the opening portions of the through hole $11x$ in the core layer 11 in a plan view of the core layer 11. The planar shapes of the opening portions of the through hole $11x$ on the sides of the first and second surfaces have sizes greater than the size of the planar shape of the electronic part 12. Said differently, the part where the electronic part 12 in inserted into the through hole $11x$ is shaped like the taper. Therefore, even if the mounting position of the electronic part 12 using the mounter is shifted from the center of the through hole $11x$, the electronic part 12 is guided by the taper shape of the through hole $11x$ so as to be accurately inserted into (provisionally arranged in) the through hole $11x$.

Further, the planar shape of the inside area of the inward protruding portion $11x_3$ of the through hole $11x$, into which the electronic part 12 is inserted, is formed to be smaller than the planar shape of the electronic part 12. Therefore, by pressing the electronic part 12, which is inserted into (provisionally arranged in) the through hole $11x$, onto the side of the inward protruding portion $11x_3$, the inward protruding portion $11x_3$ is deformed so as to be contact with the side surfaces of the electronic part 12 in the shape of the ring thereby holding (fixing) the electronic part 12.

Within the first embodiment, since the ultraviolet (UV) laser having a high rate of absorption by a metal (especially copper) is used to form the through hole $11x$, even if the metallic layer and the core layer 11 is irradiated by a laser beam, the laser beam easily penetrates the metallic layer and the through hole $11x$ can be easily formed.

Modified Example 1 of the First Embodiment

Within the modified example 1 of the first embodiment, an example that the resin part 13 is not provided is described. In the modified example 1 of the first embodiment, explanation of constructional elements the same as those described in the above description of the first embodiment is omitted.

[Structure of the Wiring Board of the Modified Example 1 of the First Embodiment]

Figure 6:
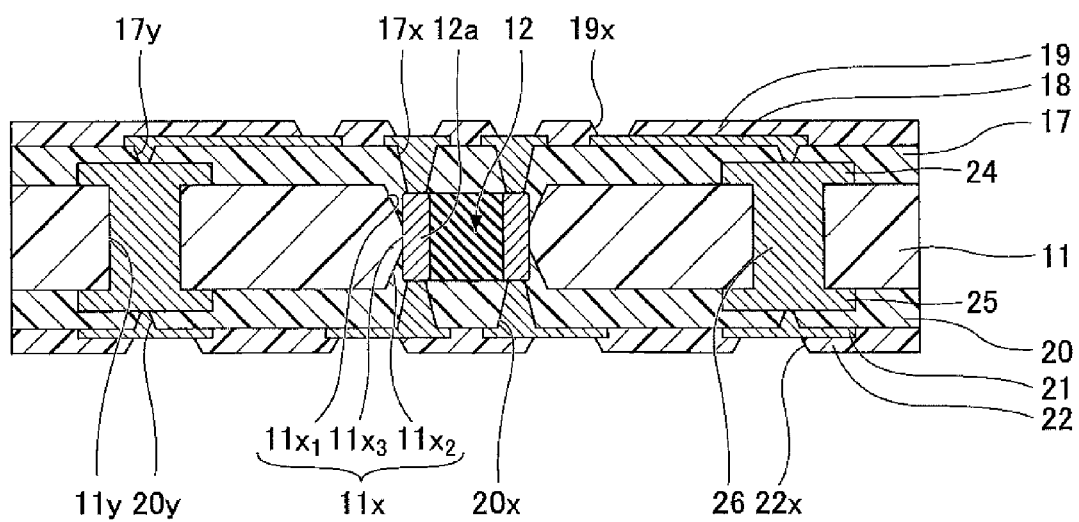
FIG. 6 illustrates a cross-sectional view of an exemplary wiring board of a modified example 1 of the first embodiment.

The structure of the wiring substrate of the modified example 1 of the first embodiment is described. FIG. 6 illustrates a cross-sectional view of an exemplary wiring board of the modified example of the first embodiment. Referring to FIG. 6, the wiring board 10A is different from the wiring board 10. The first wiring layer 14, the second wiring layer 15, and the through wiring 16 in the wiring board 10A are replaced by a first wiring layer 24, a second wiring layer 25, and through wiring 26 in the wiring board 10A.

In the wiring board 10A, the first wiring layer 24 is formed on the first surface of the core layer 11. Further, the second wiring layer 25 is formed on the second surface of the core layer 11. For example, the thicknesses of the first and second wiring layers 24 and 25 are, for example, about 10 to 20 μm. The first and second wiring layers 24 and 25 are patterned to have predetermined planar shapes. The first and second wiring layers 24 and 25 are electrically connected by the through wiring 26 filling the through hole $11y$, which penetrates the core layer 11 in its thickness directions.

The first wiring layer 24, the second wiring layer 25, and the through wiring 26, which are electrically connected via the through hole, are integrally formed. However, for convenience, a part of the integrally formed filling inside the through hole $11x$ is referred to as the through wiring 26 in the following description. Further, another part of the integrally formed, which is formed on the side of the insulating layer 17 relative to the through wiring 26, is referred to as the first wiring layer 24 in the following description. Furthermore, another part of the integrally formed, which is formed on the side of the insulating layer 20 relative to the through wiring 26, is referred to as the second wiring layer 25 in the following description.

The materials of the first and second wiring layers 24 and 25 and the through wiring 26 are, for example, copper (Cu) or the like. Each of the first and second wiring layers 24 and 25 and the through wiring 26 may be formed by a plurality of layers.

The insulating layer 17 coats the first wiring layer 24 and the first surface of the core layer 11. The insulating layer 17 coats a periphery of the electronic part 12 in the first hole $11x_1$. The insulating layer 20 coats the second wiring layer 25 and the second surface of the core layer 11. The insulating layer 20 coats a periphery of the electronic part 12 in the second hole $11x_2$. Said differently, the insulating layers 17 and 20 have a function of the resin part $13a$ of the first embodiment.

[Method of Manufacturing of the Wiring Board of the Modified Example 1 of the First Embodiment]

Figure 7:
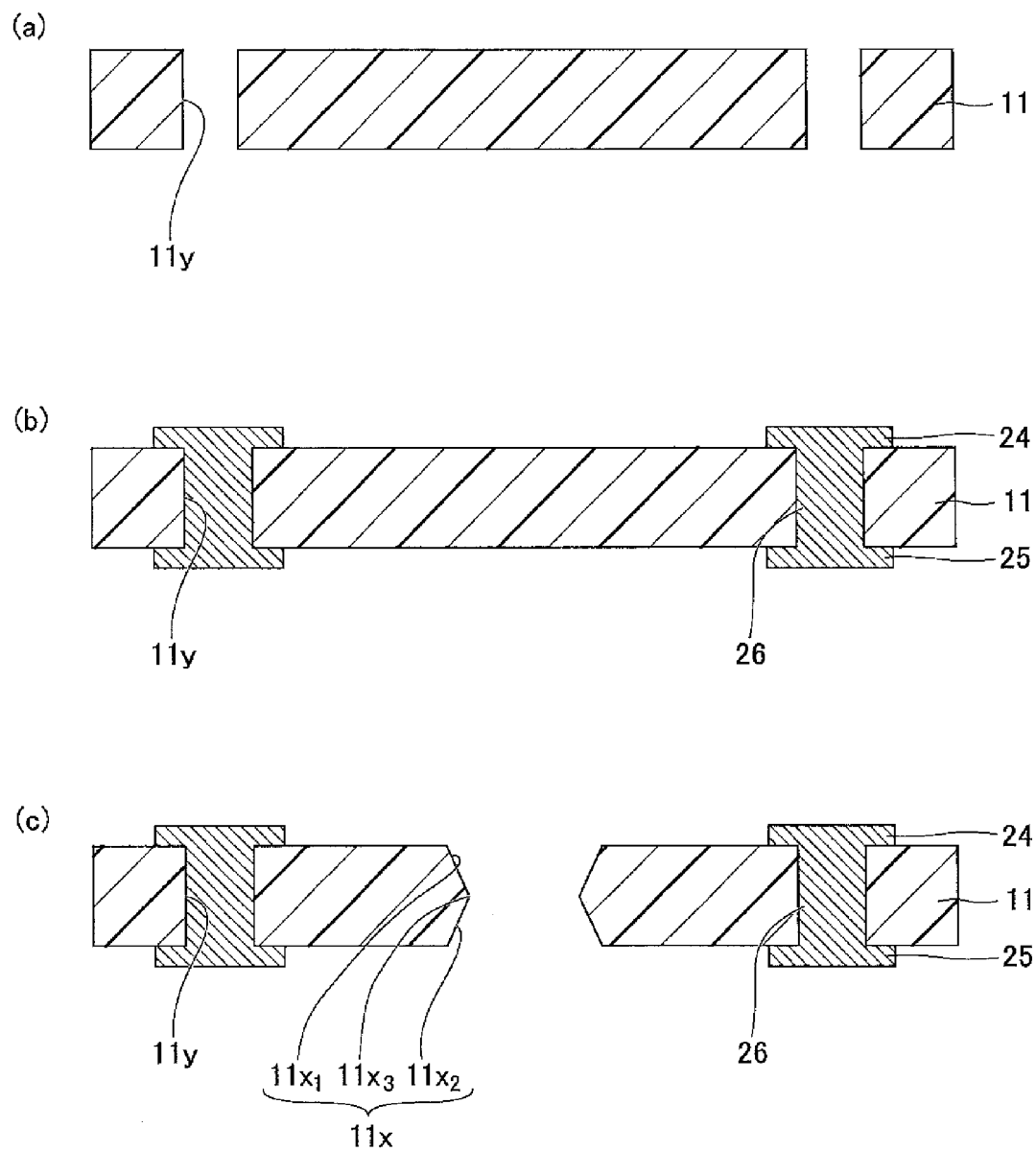
FIG. 7 illustrates an exemplary manufacturing process of the wiring board of the modified example 1 of the first embodiment.
Figure 8:
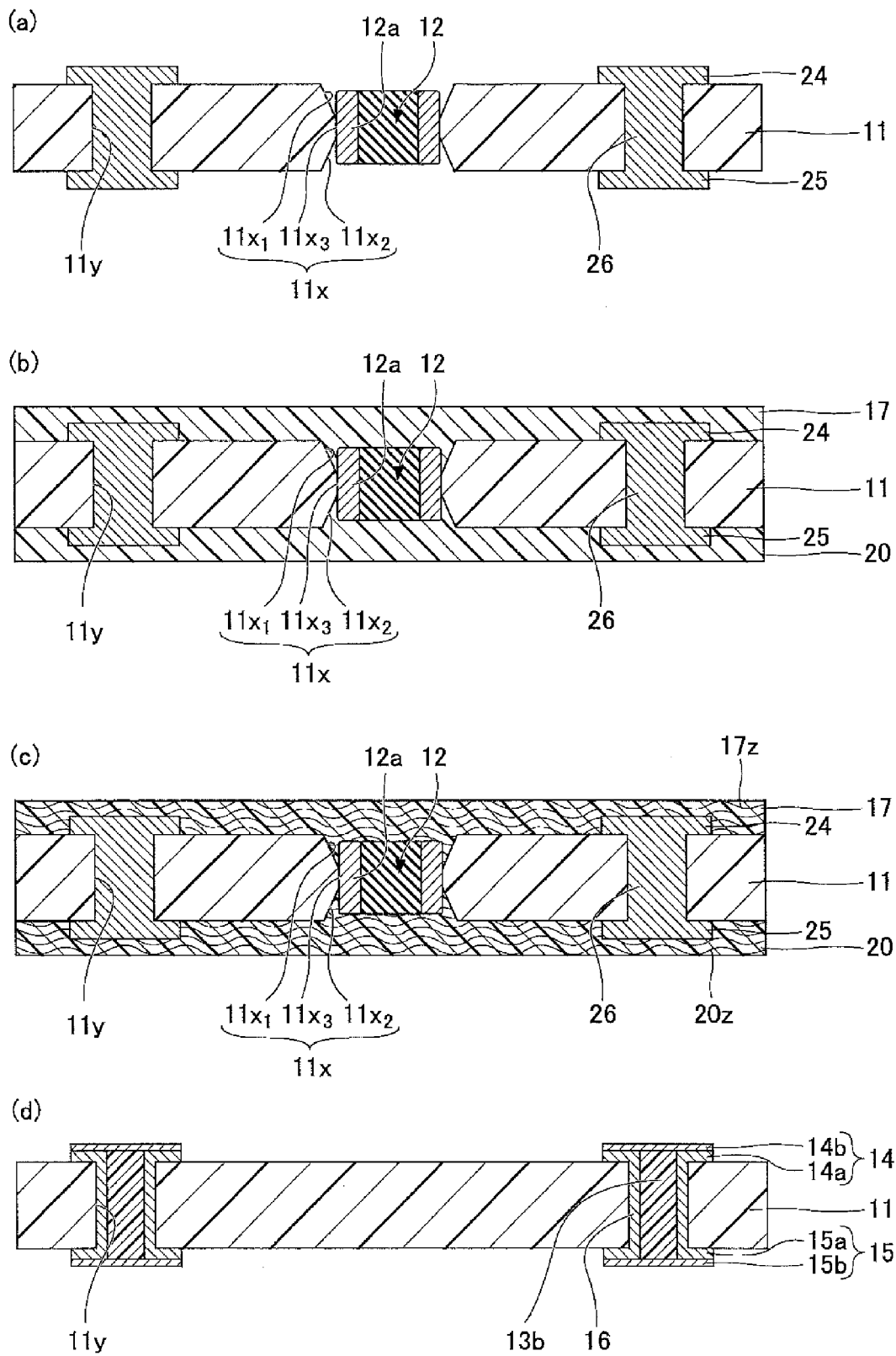
FIG. 8 illustrates the exemplary manufacturing process of the wiring board of the modified example 1 of the first embodiment.

Next, the method of manufacturing the wiring board of the modified example 1 of the first embodiment is described. FIGS. 7 and 8 illustrate exemplary manufacturing steps of the wiring board of the modified example 1 of the first embodiment.

Referring to (a) of FIG. 7, the through hole $11y$ penetrating through the core layer 11 is formed in the core layer 11. The through hole fly may be mechanically formed using, for example, a drill or the like. The through hole $11y$ may be formed by, for example, laser processing. The diameter of the through hole $11y$ is, for example, about 80 to 250 µm. After forming the through hole $11y$, desmear is preferably performed to remove residue of a resin contained in the core layer 11 attached to the inner wall surface of the through hole $11y$.

Referring to (b) of FIG. 7, the wiring layer 24 is formed on the first surface of the core layer 11, and the wiring layer 25 is formed on the second surface of the core layer 11. Further, the through wiring 26 is formed to fill the through hole $11y$ and electrically connect the wiring layer 24 to the wiring layer 25. For example, the thicknesses of the wiring layers 24 and 25 are, for example, about 10 to 20 µm. The first and second wiring layers 24 and 25 are patterned to have predetermined planar shapes. The materials of the first and second wiring layers 24 and 25 and the through wiring 26 are, for example, copper (Cu) or the like. Each of the first and second wiring layers 24 and 25 and the through wiring 26 may be formed by a plurality of layers.

Specifically, a first plating layer made of copper or the like is formed by electroless plating on, for example, the first surface of the core layer 11, the inner wall surface of the through hole $11y$, and the second surface of the core layer 11. Next, a resist pattern for exposing an area where the first and second wiring layers 24 and 25 (the portion of the wiring pattern and the portion of the through hole $11y$) are formed on the first plating layer. Next, for example, a second plating layer made of copper or the like is separated out by electroplating using the first plating layer as the power supply layer. Simultaneously, the second plating layer fills inside the through hole $11y$. Next, the resist pattern is removed. Further, the first plating layer exposed on the second plating layer is removed. With this, the first wiring layer 24, the second wiring layer 25, and the through wiring 26, which are made of the first plating layer and the second plating layer, are formed.

Next, referring to (c) of FIG. 7, the through hole $11x$ penetrating through the core layer 11 is formed in a manner similar to the processes illustrated in (c) and (d) of FIG. 2 of the first embodiment. Within the modified example 1 of first embodiment, the metallic layer is not irradiated by the laser beam. Therefore, the laser used for forming the through hole $11x$ may be ultraviolet (UV) laser or another laser other than the ultraviolet laser such as $CO_2$ laser. Next, referring to (a) of FIG. 8, the electronic part 12 is fixed inside the through hole $11x$ in a manner similar to the processes illustrated in (a) and (b) of FIG. 3 of the first embodiment.

Referring to (b) of FIG. 8, a film-like resin is laminated so as to coat the first surface of the core layer 11 and the first wiring layer 24. Further, a film-like resin is laminated so as to coat the second surface of the core layer 11 and the second wiring layer 25. The laminated film-like resins are pressed onto the first and second surfaces of the core layer 11 while heating the laminated film-like resins. A part of thus softened resin fills a periphery of the electronic part 12 inside the through hole $11x$. Thereafter, the softened resin is hardened.

Thus, the insulating layer 17 coating the first wiring layer 24, the first surface of the core layer 11, and the periphery of the electronic part 12 inside the first hole $11x_1$ are formed. Further, the insulating layer 20 coating the second wiring layer 25, the second surface of the core layer 11, and the periphery of the electronic part 12 inside the second hole $11x_2$ are formed. Instead of the laminated film-like resin, a liquid-like or paste-like epoxy resin or the like may be used. After the liquid-like or paste-like epoxy resin or the like is coated, the liquid-like or paste-like epoxy resin or the like may be hardened to form the insulating layers 17 and 20. The materials, the thicknesses, and so on of the insulating layers 17 and 20 are as described in the first embodiment.

Referring to (c) of FIG. 8, a resin film formed by impregnating reinforcing material $17z$ with a thermosetting epoxy insulating resin or a thermosetting polyimide insulating resin may be used as the insulating layer 17. Similarly, a resin film formed by impregnating reinforcing material $20z$ with a thermosetting epoxy insulating resin or a thermosetting polyimide insulating resin may be used as the insulating layer 20. The reinforcing materials $17z$ and $20z$ are, for example, a fabric cloth, a nonwoven fabric cloth, or the like such as a glass fiber or a carbon fiber.

Referring to (c) of FIG. 8, only a resin component forming the insulating layers 17 and 20 fills the inside of the through hole $11x$, and the opening portions of the through hole $11x$ closed by the reinforcing materials $17z$ and $20z$. Therefore, it is possible to prevent the electronic part 12 from protruding from the opening portions of the through hole $11x$. Referring to (b) and (c) of FIG. 8, the thickness of the electronic part 12 is made about ±20% of the thickness of the core layer 11 so that the resin component forming the insulating layers 17 and 20 sufficiently fills the inside of the through hole $11x$.

After the processes illustrated in (b) and (c) of FIG. 8, in a manner similar to the processes illustrated in (c) of FIG. 4 to (c) of FIG. 5, the wiring board (see FIG. 6) and the semiconductor package formed by mounting the semiconductor chip on the wiring board are completed.

In the modified example 1 of the first embodiment, the process illustrated in (d) of FIG. 8 may be applied instead of the processes illustrated in (a) and (b) of FIG. 7. Referring to (d) of FIG. 8, in a manner similar to the processes illustrated in (a) of FIG. 2 to (b) of FIG. 4, the wiring layer 14 is formed on the first surface of the core layer 11, the wiring layer 15 is formed on the second surface of the core layer 11, and the through wiring 16 electrically connecting the wiring layer 14 to the wiring layer 15 is formed on the inner wall surface of the through hole $11y$. The resin part $13b$ fills an inside portion of the through wiring 16. However, unlike the first embodiment, the through hole $11x$ is not formed at this stage. After the process illustrated in (d) of FIG. 8, the process on or after (c) of FIG. 7 is conducted to manufacture the wiring board corresponding to the wiring board (see FIG. 6).

Modified Example 2 of the First Embodiment

Within the modified example 2 of the first embodiment, the insulating layer and the wiring layer are multilayer and laminated in the core layer 11. In the modified example 2 of the first embodiment, explanation of constructional elements the same as those described in the above description of the first embodiment is omitted.

Figure 9:
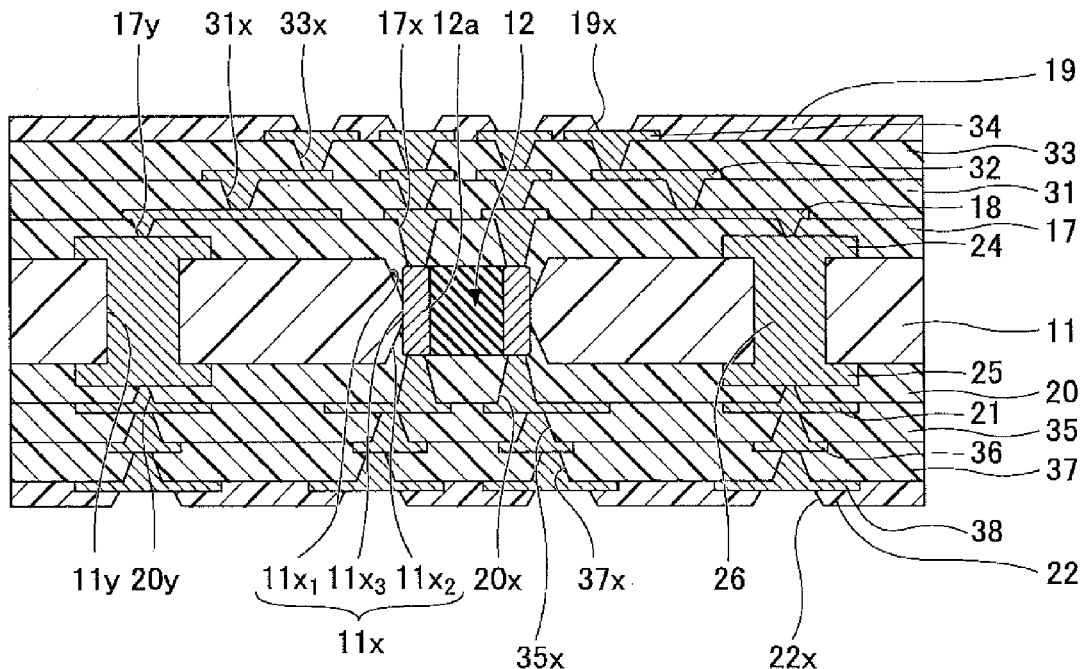
FIG. 9 illustrates a cross-sectional view of an exemplary wiring board of a modified example 2 of the first embodiment.

FIG. 9 illustrates a cross-sectional view of an exemplary wiring board of the modified example 2 of the first embodiment. Referring to FIG. 9, the wiring board 10B is different from the wiring board 10A (see FIG. 6) of the modified example 1 of the first embodiment. In the wiring board 10B of the modified example 2 of the first embodiment, an insulating layer 31, a wiring layer 32, an insulating layer 33, and a wiring layer 34 are added between the wiring layer 18 on the first surface of the core layer 11 and the solder resist layer 19. Further, in the wiring board 10B of the modified example 2 of the first embodiment, an insulating layer 35, a wiring layer 36, an insulating layer 37, and a wiring layer 38 are added between the wiring layer 21 on the second surface of the core layer 11 and the solder resist layer 22.

The insulating layer 31 is formed to coat the wiring layer 18. The insulating layer 35 is formed to coat the wiring layer 21. For example, the materials and the thickness of the insulating layers 31 and 35 may be similar to those of the insulating layer 17. The insulating layers 31 and 35 may contain a filler made of silica ($SiO_2$) or the like.

Further, a via hole 31x is formed to penetrate through the insulating layer 31 and expose the first surface of the wiring layer 18. A via hole 31x is opened on the side of the insulating layer 33. The bottom surface of the via hole 31x is formed by the first surface of the wiring layer 18. The via hole 31x is a recess shaped like a circular truncated cone, in which the area of the opening portion is greater than the area of the bottom surface. Further, a via hole 35x is formed to penetrate through the insulating layer 35 and expose the second surface of the wiring layer 21. A via hole 35x is opened on the side of the insulating layer 37. The bottom surface of the via hole 35x is formed by the first surface of the wiring layer 21. The via hole 35x is a recess shaped like a circular truncated cone, in which the area of the opening portion is greater than the area of the bottom surface.

The wiring layer 32 is formed on the first side of the insulating layer 31. The wiring layer 32 includes via wiring filling the inside of the via hole 31x, and a wiring pattern formed on the first surface of the insulating layer 31. The via wiring filling the inside of the via hole 31x is directly electrically connected to the wiring layer 18. The wiring layer 36 is formed on the second side of the insulating layer 35. The wiring layer 36 includes via wiring filling the inside of the via hole 35x, and a wiring pattern formed on the second surface of the insulating layer 35. The via wiring filling the inside of the via hole 35x is directly electrically connected to the wiring layer 21. For example, the materials and the thicknesses of the wiring layers 32 and 36 may be similar to those of the wiring layer 18.

The insulating layer 33 is formed to coat the wiring layer 32. The insulating layer 37 is formed to coat the wiring layer 36. For example, the materials and the thicknesses of the insulating layers 33 and 37 may be similar to those of the insulating layer 17. The insulating layers 33 and 37 may contain a filler made of silica ($SiO_2$) or the like.

Further, a via hole 33x is formed to penetrate through the insulating layer 33 and expose the first surface of the wiring layer 32. A via hole 33x is opened on the side of the solder resist layer 19. The bottom surface of the via hole 33x is formed by the first surface of the wiring layer 32. The via hole 33x is a recess shaped like a circular truncated cone, in which the area of the opening portion is greater than the area of the bottom surface. Further, a via hole 37x is formed to penetrate through the insulating layer 37 and expose the second surface of the wiring layer 36. A via hole 37x is opened on the side of the solder resist layer 22. The bottom surface of the via hole 37x is formed by the first surface of the wiring layer 36. The via hole 37x is a recess shaped like a circular truncated cone, in which the area of the opening portion is greater than the area of the bottom surface.

The wiring layer 34 is formed on the first side of the insulating layer 33. The wiring layer 34 includes via wiring filling the inside of the via hole 33x, and a wiring pattern formed on the first surface of the insulating layer 33. The via wiring filling the inside of the via hole 33x is directly electrically connected to the wiring layer 32. The wiring layer 38 is formed on the second side of the insulating layer 37. The wiring layer 38 includes via wiring filling the inside of the via hole 37x, and a wiring pattern formed on the second surface of the insulating layer 37. The via wiring filling the inside of the via hole 37x is directly electrically connected to the wiring layer 36. For example, the materials and the thicknesses of the wiring layers 34 and 38 may be similar to those of the wiring layer 18.

Figure 10:
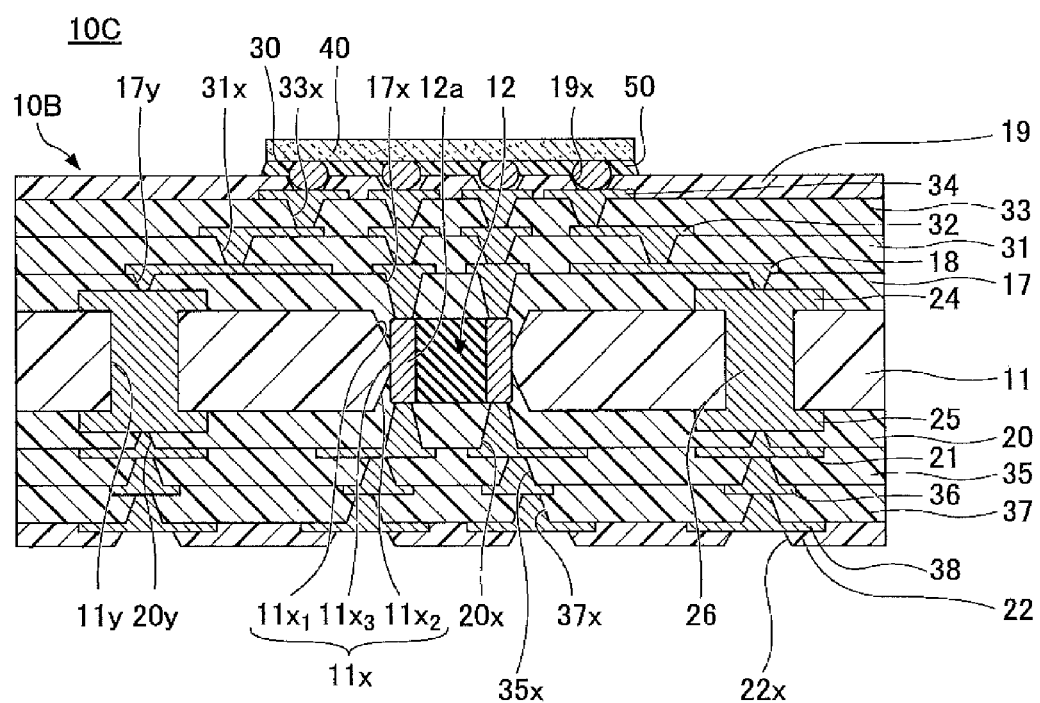
FIG. 10 is a cross-sectional view of a semiconductor package of the modified example 2 of the first embodiment.

As described, the numbers of the insulating layers and the wiring layers, which are laminated on the first and second surfaces of the core layer 11, can be arbitrarily determined. Referring to FIG. 10, the semiconductor chip 40 may be mounted on the wiring board 10B through the joining portion 30. Further, an underfill resin 50 fills a gap between the wiring board 10B and the semiconductor chip 40 to thereby form the semiconductor package 10C.

A contact between the inward protruding portion $11x_3$ of the through hole 11x and the electronic part 12 is described next. Within the first embodiment and the modified examples 1 and 2, the inward protruding portion $11x_3$ contacts the side surface of the electronic part 12 in the shape of the ring to hold the electronic part 12. However, the contact is not limited thereto. The inward protruding portion $11x_3$ may contact the electronic part 12 as illustrated in, for example, FIG. 11.

Figure 11:
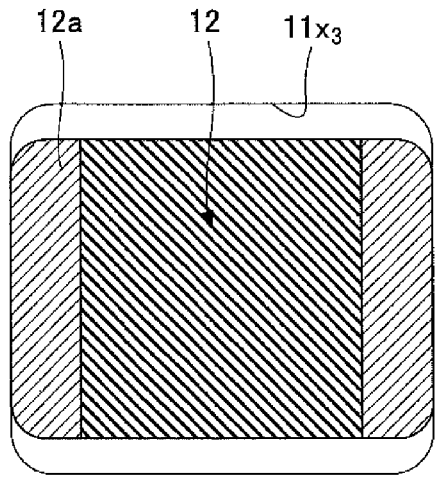
FIG. 11 illustrates cross-sectional views taken along a line A-A of (a) of FIG. 1.
Figure 11:
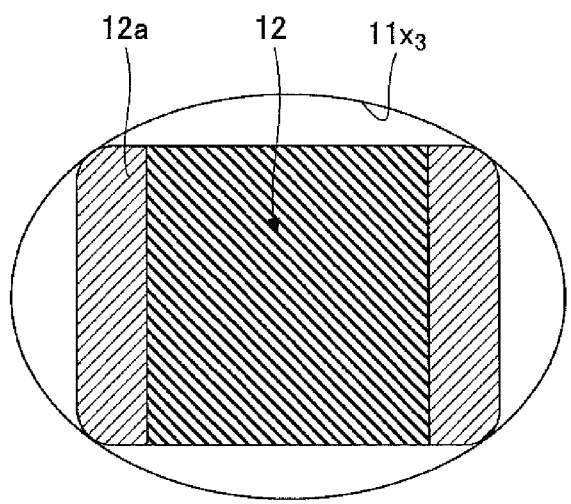
Figure 11:
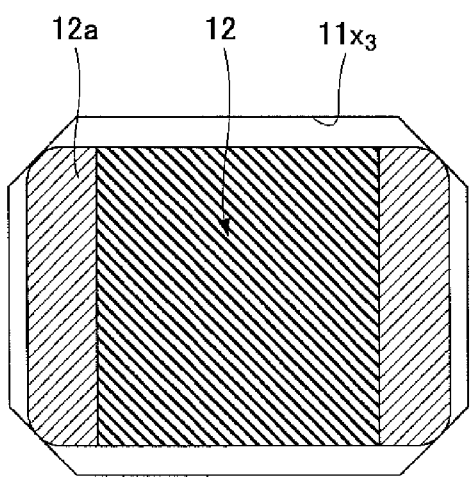

FIG. 11 is a cross-sectional view taken along a line A-A of FIG. 1. Said differently, a plan view of the cross-sectional shape along the line A-A of FIG. 1 is viewed from a side of the first surface of the core layer 11. However, referring to FIG. 11, only the inward protruding portion $11x_3$ and the electronic part 12 are illustrated. Other parts of the wiring board 10 are omitted.

When the electronic part 12 is a capacitor, if the inward protruding portion $11x_3$ is engaged with the main body of the capacitor (other than the electrode 12a), the side surfaces of the main body may be shaved to possibly vary the capacity of the capacitor. Therefore, referring to (a) of FIG. 11, by causing to engage the inward protruding portion $11x_3$ with only the part of the electrode 12a of the capacitor, the side surface of the main body is prevented from being shaved. Thus, the capacity of the capacitor is prevented from varying.

Further, referring to (b) and (c) of FIG. 11, if the planar shape of the inward protruding portion $11x_3$ is a circle (including an ellipse) or a polygon (an octagon in the modified example 2), the electronic part 12 is engaged with the inward protruding portion 11x3 at four points. Thus, the electronic part 12 is preferably aligned and held. Referring to (b) and (c) of FIG. 11, in a manner similar to (a) of FIG. 11, the inward protruding portion $11x_3$ is engaged with only the part of the electrode 12a of the capacitor.

As described, the inward protruding portion $11x_3$ may contact only a part of the electronic part 12.

Within the first embodiment and the modified examples, the ultraviolet (UV) laser beam irradiates the metallic layer and the core layer 11 to form the through hole. However, the through hole may be formed by patterning the metallic layer previously and subsequently by irradiating an area (a resin area), which is not coated by the metallic layer, with a laser beam. In this case, the ultraviolet laser may be used, and $CO_2$ laser or the like may be used. Whether the ultraviolet laser or the $CO_2$ laser is used, the through hole 11x in a shape illustrated in FIG. 1 or the like can be formed.

According to the disclosed technique, it is possible to provide the wiring board, in which an electronic part can be easily accommodated in a through hole, and a method of manufacturing the wiring board.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A wiring board comprising:
   a core layer;
   a through hole penetrating through the core layer in a thickness direction of the core layer; and
   an electronic part accommodated inside the through hole,
   wherein the through hole includes
      a first opening portion provided on a first surface of the core layer,
      a second opening portion provided on a second surface of the core layer, and
      an inward protruding portion inwardly protruding relative to the first and second opening portions,
   wherein the electronic part is held by the inward protruding portion,
   wherein an insulating layer and a wiring layer are sequentially laminated on the first surface of the core layer,
   wherein the wiring layer includes a wiring pattern formed on a first surface of the insulating layer, and wherein the wiring layer includes via wiring which is formed inside the insulating layer and electrically connected to an electrode of the electronic part.

2. The wiring board according to claim 1,
   wherein the inward protruding portion is positioned on an inner wall surface of the through hole in a middle of the core layer in the thickness direction.

3. The wiring board according to claim 2,
   wherein the inward protruding portion is positioned within a range of ±20% from a center of the core layer in its thickness direction.

4. The wiring board according to claim 1,
   wherein the inward protruding portion is shaped like a ring, and
   the inward protruding portion contacts a side surface of the electronic part.

5. The wiring board according to claim 1,
   wherein the through hole includes
      a first hole including the first opening portion and a first apex portion, a cross-sectional area of the first hole being continuously reduced from an area of the first opening portion to an area of the first apex portion along a thickness direction of the core layer, and
      a second hole including the second opening portion and a second apex portion, a cross-sectional area of the second hole being continuously reduced from an area of the second opening portion to an area of the second apex portion along a thickness direction of the core layer,
   wherein the first apex portion is connected to the second apex portion to form the inward protruding portion having a smallest area in the cross-sectional area of the through hole.

6. The wiring board according to claim 1,
   wherein another insulating layer and another wiring layer are sequentially laminated on the second surface of the core layer, and
   the other wiring layer includes another wiring pattern formed on a second surface of the other insulating layer and another via wiring, which is formed inside the other insulating layer and electrically connected to the electrode of the electronic part.

7. The wiring board according to claim 6,
   wherein a resin part fills a periphery of the electronic part inside the through hole,
   the insulating layer coats the resin part,
   the other insulating layer coats the resin part,
   the electrode is directly electrically connected to the via wiring, and
   the electrode is directly electrically connected to the other via wiring.

8. The wiring board according to claim 1,
   wherein a planar shape of the through hole is substantially similar to a planar shape of the electronic part.

9. The wiring board according to claim 1,
   wherein the electronic part is a capacitor, and
   wherein the inward protruding portion is engaged with only a part of the electrode of the electronic part.

10. A method of manufacturing a wiring board comprising:
    forming a through hole penetrating through a core layer in a thickness direction of the core layer, the through hole including a first opening portion provided on a first surface of the core layer, a second opening portion provided on a second surface of the core layer, and an inward protruding portion whose inner wall surface inwardly protrudes relative to the first and second opening portions;
    provisionally arranging an electronic part on the inward protruding portion inside the through hole;
    causing the electronic part to be held inside the inward protruding portion by pressing the electronic part toward the inward protruding portion; and
    sequentially laminating an insulating layer and a wiring layer on the first surface of the core layer so that the wiring layer includes a wiring pattern formed on a first surface of the insulating layer and the wiring layer includes a via wiring which is formed inside the insulating layer and electrically connected to an electrode of the electronic part.

11. The method of manufacturing the wiring board according to claim 10,
    wherein the forming the through hole forms the inward protruding portion to be in a ring-like shape,
    in the causing the electronic part to be held, a side surface of the electronic part contacts the inward protruding portion.

12. The method of manufacturing the wiring board according to claim 11,
    wherein, in the forming the through hole, planar shapes of the first and second opening portions of the through hole are greater than a planar shape of the electronic part, and a planar shape of an inside area of the inward protruding portion is smaller than the planar shape of the electronic part,
    in the causing the electronic part to be held, the inward protruding portion deforms by pressing the electronic part toward the inward protruding portion so that the side surface of the electronic part contacts the inward protruding portion.

13. The method of manufacturing the wiring board according to claim 10,
wherein the forming the through hole includes
preparing a laminated plate including the core layer having a first metallic foil on the first surface of the core layer and a second metallic foil on the second surface of the core layer,
forming a first hole by irradiating the first metallic foil and the core layer with an ultraviolet laser beam, the first hole including the first opening portion having a greatest area in a cross-sectional area of the first hole, and
forming a second hole by irradiating the second metallic foil and the core layer with an ultraviolet laser beam, the second hole including the second opening portion having a greatest area in a cross-sectional area of the second hole so that the inward protruding portion is formed at a portion connecting the first hole and the second hole.

14. The method of manufacturing the wiring board according to claim 10,
wherein the through hole is formed such that the inward protruding portion is positioned on an inner wall surface of the through hole within a range of ±20% from a center of the core layer in its thickness direction.

15. The method of manufacturing the wiring board according to claim 10,
wherein the through hole is formed such that a planar shape of the through hole is substantially similar to a planar shape of the electronic part.

16. The method of manufacturing the wiring board according to claim 8,
wherein the electronic part is a capacitor, and
wherein the inward protruding portion is engaged with only a part of the electrode of the electronic part.

17. A wiring board comprising:
a core layer;
a through hole penetrating through the core layer in a thickness direction of the core layer; and
an electronic part accommodated inside the through hole, the electronic part including an electronic part main body and an electrode,
wherein the through hole includes
a first opening portion provided on a first surface of the core layer,
a second opening portion provided on a second surface of the core layer, and
an inward protruding portion inwardly protruding relative to the first and second opening portions,
wherein the electronic part is held by the inward protruding portion, and
wherein a wiring layer is electrically connected to the electrode of the electronic part.

18. The wiring board according to claim 17,
wherein the inward protruding portion is positioned on an inner wall surface of the through hole in a middle of the core layer in the thickness direction.

19. The wiring board according to claim 18,
wherein the inward protruding portion is positioned within a range of ±20% from a center of the core layer in its thickness direction.

20. The wiring board according to claim 17,
wherein the inward protruding portion is shaped like a ring, and
wherein the inward protruding portion contacts a side surface of the electronic part.

21. The wiring board according to claim 17,
wherein the through hole includes
a first hole including the first opening portion and a first apex portion, a cross-sectional area of the first hole being continuously reduced from an area of the first opening portion to an area of the first apex portion along a thickness direction of the core layer, and
a second hole including the second opening portion and a second apex portion, a cross-sectional area of the second hole being continuously reduced from an area of the second opening portion to an area of the second apex portion along a thickness direction of the core layer, and
wherein the first apex portion is connected to the second apex portion to form the inward protruding portion having a smallest area in the cross-sectional area of the through hole.

22. The wiring board according to claim 17,
wherein a planar shape of the through hole is substantially similar to a planar shape of the electronic part.

23. The wiring board according to claim 17,
wherein the electronic part is a capacitor, and
wherein the inward protruding portion is engaged with only a part of the electrode of the electronic part.

* * * * *